(12) United States Patent
Chang et al.

(10) Patent No.: US 6,937,106 B2
(45) Date of Patent: Aug. 30, 2005

(54) BUILT-IN JITTER MEASUREMENT CIRCUIT FOR VOLTAGE CONTROLLED OSCILLATOR AND PHASE LOCKED LOOP

(75) Inventors: Yeong-Jar Chang, Hsinchu (TW); Shen-Tien Lin, Hsinchu (TW); Wen-Ching Wu, Hsinchu (TW); Kun-Lun Luo, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 64 days.

(21) Appl. No.: 10/749,560

(22) Filed: Jan. 2, 2004

(65) Prior Publication Data

US 2005/0057312 A1 Mar. 17, 2005

(30) Foreign Application Priority Data

Sep. 16, 2003 (TW) ........................................ 92125529 A

(51) Int. Cl.[7] .............................................. G01R 23/00
(52) U.S. Cl. .............................. 331/44; 331/74; 331/16; 331/1 A; 324/76.53; 327/156; 327/159; 327/160; 714/704; 714/731; 714/733; 714/738; 375/376; 375/371
(58) Field of Search ........................... 331/1 A, 16, 74, 331/44; 324/76.53; 327/156, 159, 160; 714/704, 731, 733, 738; 375/371, 376

(56) References Cited

U.S. PATENT DOCUMENTS

| 6,661,266 B1 | * | 12/2003 | Variyam et al. | 327/159 |
| 2003/0076181 A1 | * | 4/2003 | Tabatabaei et al. | 331/57 |
| 2003/0098731 A1 | * | 5/2003 | Tabatabaei et al. | 327/160 |

* cited by examiner

Primary Examiner—Arnold Kinkead
(74) Attorney, Agent, or Firm—Bacon & Thomas, PLLC

(57) ABSTRACT

A built-in jitter measurement circuit for a VCO (voltage-controlled oscillator) and a PLL (phase-locked loop) is disclosed. The circuit includes a divider for dividing frequency of a signal, a time to digital converter (TDC) for converting the period of the divided signal into digital values, a variance calculator for calculating variance of the period of the divided signal, a mean calculator for calculating mean value of the period of the divided signal, a encoder and counter for encoding and calculating the period of the divided signal, and a state controller as a controller for all other components. The circuit disclosed utilizes output clock of an opened-loop circuit to be measured and a divider for increasing jitter of the original signal. By measuring the bandwidth of a closed-loop circuit, accordingly, jitter of output clock of an opened-loop or an closed-loop circuit is measured by correlating the measured bandwidth and the jitter values from extrapolation.

6 Claims, 7 Drawing Sheets

| Steps | Actual depicted time | T.E. | Indicated depicted time | Error | E.E. | Indicated depicted time | Error |
|---|---|---|---|---|---|---|---|
| 0 | 0 | 0 | 0 | 0 | 0 | 0 | 0 |
| 1 | 0.2ns | 1 | 0.3ns | 33% | 1 | 0.3ns | 33% |
| 2 | 0.4ns | 2 | 0.6ns | 67% | 1 | 0.3ns | 33% |
| 3 | 0.6ns | 3 | 0.9ns | 100% | 2 | 0.6ns | 0 |
| 4 | 0.8ns | 4 | 1.2ns | 133% | 3 | 0.9ns | 33% |
| 5 | 1.2ns | 5 | 1.5ns | 100% | 4 | 1.2ns | 0 |
| 6 | 1.6ns | 6 | 1.8ns | 67% | 5 | 1.5ns | 33% |
| 7 | 2ns | 7 | 2.1ns | 33% | 7 | 2.1ns | 33% |
| 8 | 2.4ns | 8 | 2.4ns | 0 | 8 | 2.4ns | 0 |

FIG. 8

| Input | | | Output | | Jitter | Error |
|---|---|---|---|---|---|---|
| $T$ (ns) | $n$ | $\sigma_x$(ps) | mean | var2 | $\sigma_m$ (ps) | (%) |
| 40 | 64 | 300 | 8544 | 63 | 297.3 | -0.91 |
| 20 | 64 | 300 | 4273 | 61 | 292.5 | -2.52 |
| 10 | 64 | 300 | 2138 | 62 | 294.6 | -1.79 |
| 8 | 64 | 300 | 1711 | 59 | 287.3 | -4.23 |
| 4 | 64 | 300 | 856 | 64 | 299.1 | -0.31 |
| 2 | 64 | 300 | Unable to simulate | | | |

FIG. 9

| Input | | | Output | | Jitter | Error |
|---|---|---|---|---|---|---|
| $T$ (ns) | $n$ | $\sigma_x$(ps) | mean | $T$ (ns) | $\dfrac{\sigma_m \text{ (ps)}}{n}$ | (%) $\sigma_x$(ps) |
| 10 | 2 | 300 | 69 | 1 | 0.2050 | -31.68 |
| 10 | 4 | 300 | 137 | 4 | 0.2920 | -2.68 |
| 10 | 8 | 300 | 269 | 8 | 0.2974 | -0.87 |
| 10 | 12 | 300 | 412 | 14 | 0.3146 | 4.87 |
| 10 | 16 | 300 | 536 | 17 | 0.3077 | 2.56 |
| 10 | 24 | 300 | 804 | 24 | 0.2985 | -0.50 |
| 10 | 32 | 300 | 1071 | 33 | 0.3034 | 1.14 |
| 10 | 64 | 300 | 2138 | 62 | 0.2946 | -1.79 |
| 10 | 128 | 300 | 4274 | 131 | 0.3030 | 0.99 |
| 10 | 96 | 1000 | 3205 | 1094 | 1.0112 | 1.12 |
| 10 | 128 | 1000 | Unable to simulate | | | |

FIG. 10

| Input | | | Output | | Jitter | Error (%) |
|---|---|---|---|---|---|---|
| $T$ (ns) | $n$ | $\sigma_x$(ps) | mean | $\dfrac{T}{n}$ (ns) | $\sigma_m$ (ps) | $\sigma_x$(ps) |
| 10 | 64 | 50 | 2138 | 4 | 74.8 | 49.67 |
| 10 | 64 | 100 | 2138 | 9 | 112.3 | 12.25 |
| 10 | 64 | 150 | 2138 | 17 | 154.3 | 2.85 |
| 10 | 64 | 200 | 2138 | 29 | 201.5 | 0.75 |
| 10 | 64 | 300 | 2138 | 62 | 294.6 | -1.79 |
| 10 | 64 | 500 | 2137 | 171 | 489.5 | -2.09 |
| 10 | 64 | 1000 | 2136 | 667 | 967.3 | -3.27 |
| 10 | 64 | 2000 | Unable to simulate | | | |
| 1.5 | 1024 | 100 | 5129 | 117 | 101.2 | 1.23 |
| 1.5 | 1024 | 80 | 5128 | 77 | 82.14 | 2.67 |
| 1.5 | 1024 | 60 | 5128 | 42 | 60.66 | 1.10 |
| 1.5 | 1024 | 50 | 5128 | 29 | 50.41 | 0.81 |
| 1.5 | 1024 | 40 | 2136 | 19 | 40.80 | 2.00 |

FIG. 11

BUILT-IN JITTER MEASUREMENT CIRCUIT FOR VOLTAGE CONTROLLED OSCILLATOR AND PHASE LOCKED LOOP

FIELD OF THE INVENTION

This invention relates to a built-in jitter measurement circuit for a voltage-controlled oscillator (VCO) and a phase-locked loop (PLL), wherein a divider is utilized for outputting the increasing jitter of the signal to be measured such that the jitter of the original un-divided signal is determined by some derivations.

BACKGROUND OF THE INVENTION

A voltage-controlled oscillator (VCO) and a phase-locked loop (PLL) are commonly used components in many circuit designs. Jitter of the output clock signal in a VCO or a PLL determine the quality even the performance of the output signal. Therefore jitter measurement in a VCO and a PLL becomes indispensable in the field of circuit design.

As a result of the rapid advancement of VLSI technology, Frequently, a SoC (System on A Chip) has an embedded PLL. However, there are many restrictions posed when external measuring equipment measures a built-in PLL. Such restrictions include noise from measuring environment and package pins, bandwidth limitation of the external measuring equipment and lack of input and output interface for built-in PLL to external. Compare with prior art methods measuring by external equipment, an internal measuring circuit has advantages such as low cost, faster measuring, better precision, less restriction on measuring capacity, and ability to perform at-speed testing.

Jitter is often less than several hundred pico seconds in many cases. Conventionally, internal measurement technologies are usually implemented by analog designs, which are complicated and expensive.

LogicVision Inc. utilizes components including delay-lines for adjusting delays, flip-flops and counters for counting timing intervals, and then combining with statistics method for calculating jitter. Nonetheless, its precision and accuracy are limited to the resolution of the delay-lines and the setup time of the flip-flops.

Credence utilizes built-in clock generators for generating clocks of predefined periods. A signal to be measured is used for triggering the generated clocks. First cycle trigger the first generated clock and second cycle trigger the second generated clock. After the phase of the first generated clock matches the phase of the second generated clock, the period of the signal to be measured is determined by the number of cycles required for phase matching. By measuring the periods of the signal repeatedly, the jitter of the signal is determined combined with statistics method. The internal clock generators and matching decision devices used in such method restrict precision and accuracy of jitter measurement. Such method also requires extra device for performing statistics calculation and results in larger circuit area.

Precision level of jitter measurement taken by aforementioned methods only reaches several hundred pico seconds. Antonio H. Chan and Gordon W. Roberts proposed a paper titled "A Synthesizable, Fast and High-resolution Timing Measurement Device Using a Component-invariant Vernier Delay Line" in the International Test Conference, 2001. Chan and Roberts applied a differential method for overcoming the precision restriction caused by minimum delay of a component. However, the extra design cost grows exponentially with improved precision, also, the differential values of components will shift when implemented in different manufacturing process and result in undetermined precision and undesirable accuracy.

SUMMARY OF THE INVENTION

The present invention provides a built-in jitter measurement circuit for a voltage-controlled oscillator (VCO) and a phase-locked loop (PLL) in a SoC for eliminating the need of external high-end tester, the interference from noise of environment, noise of output and input pins in measurement.

The main objective of the present invention is to provide a built-in jitter measurement circuit, wherein period jitter and long-term jitter are determined by statistics calculation performed by the circuit and as a result eliminating the needs for massive data output and a process for complicated statistical analysis of the data.

Another objective of the present invention is to provide a built-in jitter measurement circuit, wherein a test integration method and a test subtraction method are applied for increasing precision and accuracy of jitter measurement.

Another objective of the present invention is to provide a built-in jitter measurement circuit, wherein an all digital standard cell-based design is adapted for increasing reliability and noise immunity. Such design avoids difficulties faced in analog designed and is suited for different manufacturing processes.

Another objective of the present invention is to provide a built-in jitter measurement circuit, wherein the measurement circuit is embedded with DfT (Design for Test) for ensuring the test quality.

Another objective of the present invention is to provide a built-in jitter measurement circuit, wherein the circuit is applicable to a core-based self test circuit in a SoC.

Another objective of the present invention is to provide a built-in jitter measurement circuit, wherein measuring the divided and jitter increased signal of the output clock of the opened-loop circuit and accordingly long-term jitter of the output clock of the opened-loop circuit can be determined.

Another objective of the present invention is to provide a built-in jitter measurement circuit, wherein jitter measured from several measurements are calculated by extrapolation for recovering the period jitter and eliminating the error caused in measurement.

Another objective of the present invention is to provide a built-in jitter measurement circuit, by measuring the bandwidth of a closed-loop circuit, accordingly, jitter of output clock of the closed-loop, which is jitter defined in a PLL, is measured by correlating the measured bandwidth and the jitter from extrapolation.

Another objective of the present invention is to provide a built-in jitter measurement circuit, wherein TDC comprising latch chain is adapted for measuring periods. The present invention is characterized by being able to perform operating modes of HOLD, CLEAR and RUN in the same cycle, and a fact that values represented by digital output are in proportion to the time of the periods.

Another objective of the present invention is to provide a built-in jitter measurement circuit, where the circuit performs statistical calculation. The outputs of the TDC and the square of the outputs are added up for determining the jitter of the signal.

Another objective of the present invention is to provide a built-in jitter measurement circuit, equalization encoding is applied for linearizing the output of the TDC and balancing the difference between rising-time and falling-time of the signal in a standard cell in the latch chains so that measurement errors are reduced and enhancing the precision.

BRIEF DESCRIPTION OF THE DRAWINGS

FIG. 8 is a data diagram illustrating comparison between linear encoding and equalization encoding;

FIG. 9 is a data diagram illustrating simulation results of different input periods;

FIG. 10 is data diagram illustrating simulation results of different divided settings; and FIG. 11 is a data diagram illustrating simulation results of different input jitter.

DETAILED DESCRIPTION OF THE PREFERRED EMBODIMENTS (I) Jitter Measurement Scheme FIG. 1 describes a Gaussian distribution of jitter for periodical signal, where t is a random variable of signal's period, p(t) is a probability density and $\sigma_x$ is the standard deviation. FIG. 2 describes measurement results of long-term jitter of an opened-loop and a closed-loop circuits, where T is time, $\sigma_L(T)$ is a long-term jitter for T, $\kappa$ is a constant coefficient, and $\tau_L$ is the loop bandwidth of a closed-loop circuit. For an opened-loop signal, if its period is T and period jitter is $\sigma_P$, then the n-periods long-term jitter for it is $\sigma_L(nT)=\sqrt{n}*\sigma_P$. However, the long-term jitter for a closed-loop circuit is expected to be stabilized as $$\sigma_L(\tau_L) = \sqrt{\frac{\tau_L}{T}} * \sigma_P$$

when the measurement time is longer than $\tau_L$. Such stabilized long-term jitter measurement of a closed-loop circuit is considered as the jitter measurement of a PLL.

Figure 1:
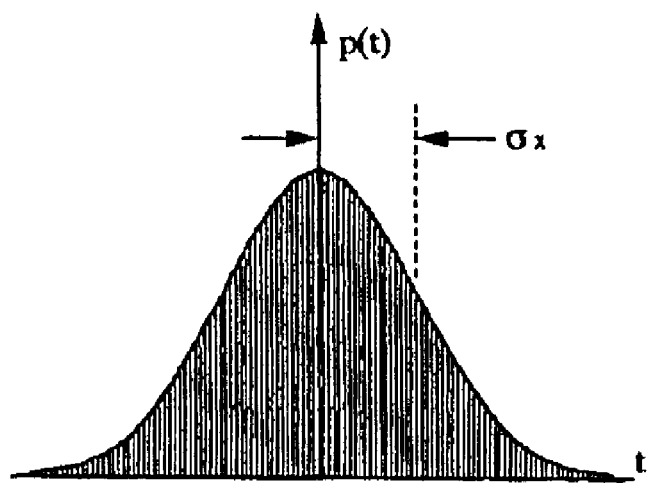
FIG. 1 is a Gaussian distribution diagram of periodical signal jitter.
Figure 2:
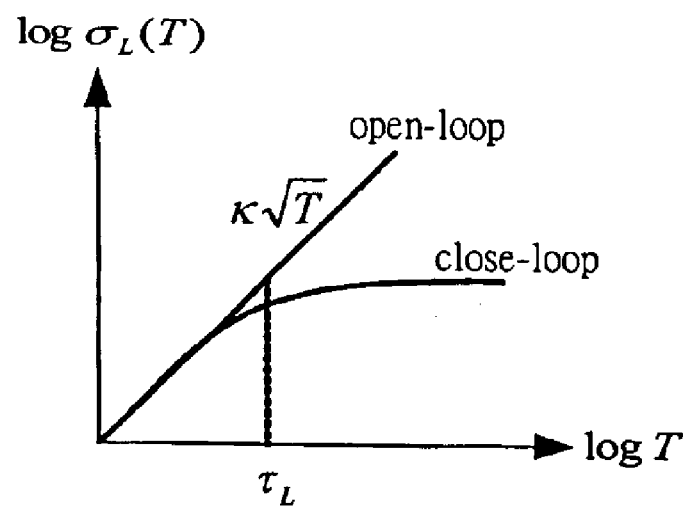
FIG. 2 is a curve diagram illustrating measurement of an opened-loop and a closed-loop jitter.
Figure 3:
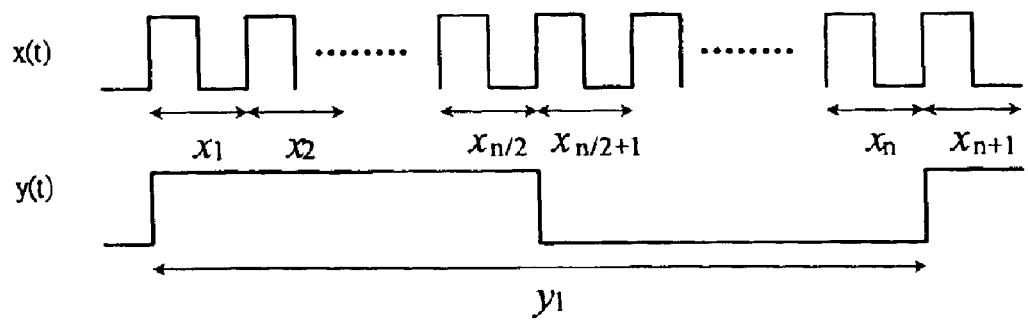
FIG. 3 is a diagram illustrating waveform correlation between signal to be measured x(t) and divided signal to be measured y(t)

Based on the conclusions above, as shown in the FIG. 3, if a periodic signal to be measured is x(t), period of each cycle is $x_1, x_2, x_3 \ldots$, signal divided by n is y(t), each period set is $y_1, y_2, y_3 \ldots$, and then equations are described as follows:

$y_1 = x_1 + x_2 + \ldots + x_n$ $y_2 = x_{n+1} + x_{n+2} + \ldots + x_{2n}$

...

$y_k = x_{(k-1)n+1} + x_{(k-1)n+2} + \ldots + x_{kn}$

...

Also, new random variables are defined as follows:

$S_1 = \{x_1, x_{n+1}, x_{2n+1}, \ldots\}$ $S_2 = \{x_2, x_{n+2}, x_{2n+2}, \ldots\}$ $S_3 = \{x_3, x_{n+3}, x_{2n+3}, \ldots\}$

...

$Y = \{y_1, y_2, y_3, \ldots\}$

As a result, $Y = S_1 + S_2 + S_3 + \ldots + S_n$. Because $S_k$ (k=1,2,...,n) are random variables independent of each other for a opened-loop PLL or VCO, therefore equations are described as follows:

$M_Y = M_{S_1} + M_{S_2} + \ldots + M_{S_n}$ $\sigma^2_Y = \sigma^2_{S_1} + \sigma^2_{S_2} + \ldots + \sigma^2_{S_n}$ For random variables, $M_{s1} = M_{s2} = \ldots = M_{sn} = M_X$ and $\sigma_{s1} = \sigma_{s2} = \ldots = \sigma_{sn} = \sigma_X$, accordingly the equation is reduced to:

$M_Y = nM_X$ $\sigma^2_Y = n\sigma^2_X$

The jitter of the signal to be measured x(t) is too low to be accurately measured. On the other hand, the jitter of the signal to be measured y(t) is not. So by measuring the jitter of the signal divided by n, y(t), long-term jitter of signal x(t) with n times period is attained. Also, it follows that the period jitter ($\sigma_X$) of x(t) can also be attained. In addition, If there are errors caused by frequency divider or other factors, a new random variable $E = \{e_1, e_2, e_3, \ldots\}$ is defined to represent the errors. Accordingly, equations are represented as follows:

$Y' = \{y_1 + e_1, y_2 + e_2, y_3 + e_3, \ldots\}$ $M_{Y'} = nM_X + M_E$                               (EQU-1)

$\sigma^2_{Y'} = n\sigma^2_X + \sigma^2_E$

Figure 4A:
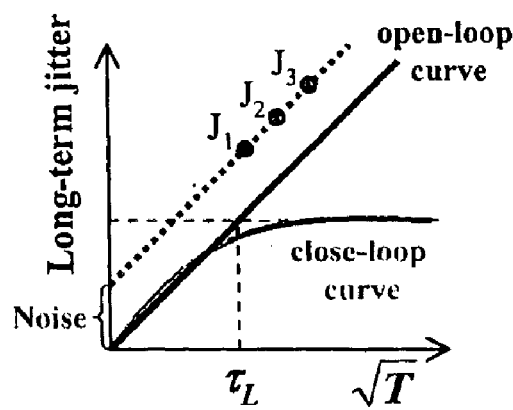
FIG. 4a is a schematic curve diagram illustrating the jitter measurement method used according to the present invention.
Figure 4B:
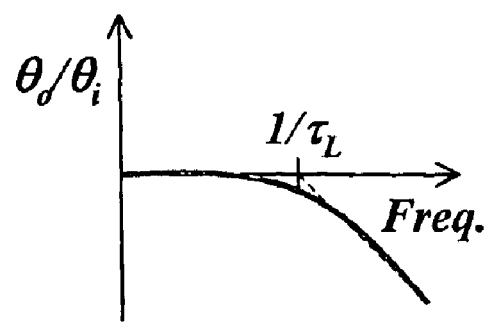
FIG. 4b is a curve diagram illustrating frequency response of a PLL.

According to the equations, calibration can be performed as long as measurement data by setting different n is provided. Thus errors are corrected and measurement accuracy is enhanced. In other words, the long-term jitter of the original signal can be attained by measuring the period jitter of the signal having frequency divided according to the conclusion reached above. As $J_1, J_2, J_3$ and the curve linked in between shown in FIG. 4a, opened-loop curve is attained after measurement errors are calibrated by setting different n and extrapolation is conducted. Then as shown in the FIG. 4b, $\tau_L$ is the inverse of the measurement of the bandwidth of the PLL when input frequency is set in increments. Apply the $\tau_L$ in the FIG. 4a. The jitter of PLL $J_{PLL}$ (short for stabilized value of long-term jitter of a closed-loop PLL) is thus attained at the intersection of opened-loop curve and the $\tau_L$ curve.

(II) An Implementation of Embedded Jitter Measurement Circuit

An embedded jitter measurement circuit is described as the following. The circuit is provided for measuring signal after frequency dividing and is based on the equations as follows:

$$M_y = \sum_{i=1}^{N} y_i / N$$

-continued $$\sigma_y^2 = \left(\sum_{i=1}^{N} y_i^2 / N\right) - M_y^2$$

The divisor N in the equations above can be set as $2^7=128$ to reduce the hardware area.

Figure 5:
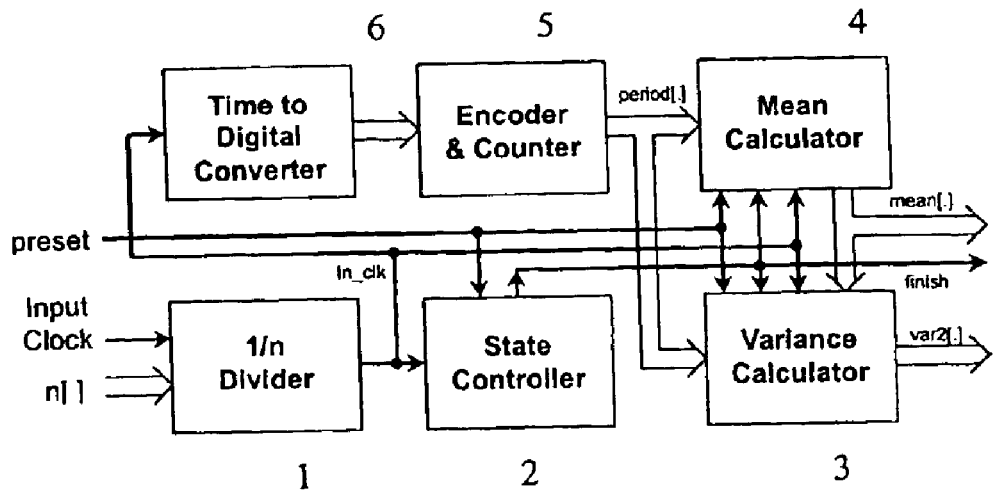
FIG. 5 is a design block diagram illustrating the jitter measurement circuit.

As shown in FIG. 5, a block diagram of the embedded circuit is described which includes a 1/n Divider 1, a state controller 2, a variance calculator 3, a mean calculator 4, a encoder and counter 5, and a time to digital converter (TDC) 6.

The circuit operates as following steps. The divider 1 divides an input signal and outputs a signal, which is easier to be measured than the original signal. The period of the divided signal is converted into digital values by TDC 6, encoder and counter 5. The digital values are put into calculation by the variance calculator 3 and the mean calculator 4 for calculating the mean of period and jitter value of the divided signal. The jitter value calculated represents the long-term jitter of the original signal with a period of n times. In addition, because the n can be sets to different values, an equation 11 can be applied for calculating the period jitter of the original signal.

Figure 6A:
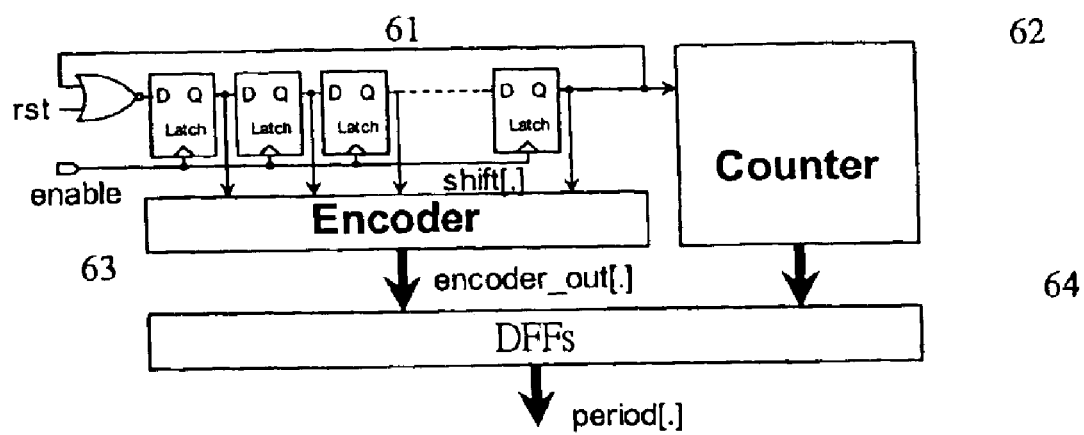
FIG. 6a is a design block diagram illustrating a time to digital converter (TDC)

The design of the TDC 6 is shown in the FIG. 6a. The TDC 6 includes a latch chain 61, a counter 62, an encoder 63 and a set of D flip-flops 64. Digital output values represent the time when the input signal during high level. By appropriate timing setting, the TDC performs operating modes of HOLD, RUN and CLEAR in a single synchronous cycle according to the present invention. When signal enable goes to low level, the latch chain 61 stop to transmit signal, the operating mode is in HOLD mode. When the signal enable goes to high level and the reset signal goes to low level, the signal will be inversed at a NOR-gate and circulate in the latch chain 61, the operating mode is in RUN mode. When the signal enable goes to high level and the reset signal goes to high level, the latch chain continues to circulate digital value zero until the whole loop is stored with digital value zero, the operation mode is in CLEAR mode. Because rise delay time and the fall delay time may not be the same in the latch chain 61, equalization encoding is used in the present invention for enabling a linear curve between the TDC output and the period of the original signal.

Figure 6B:
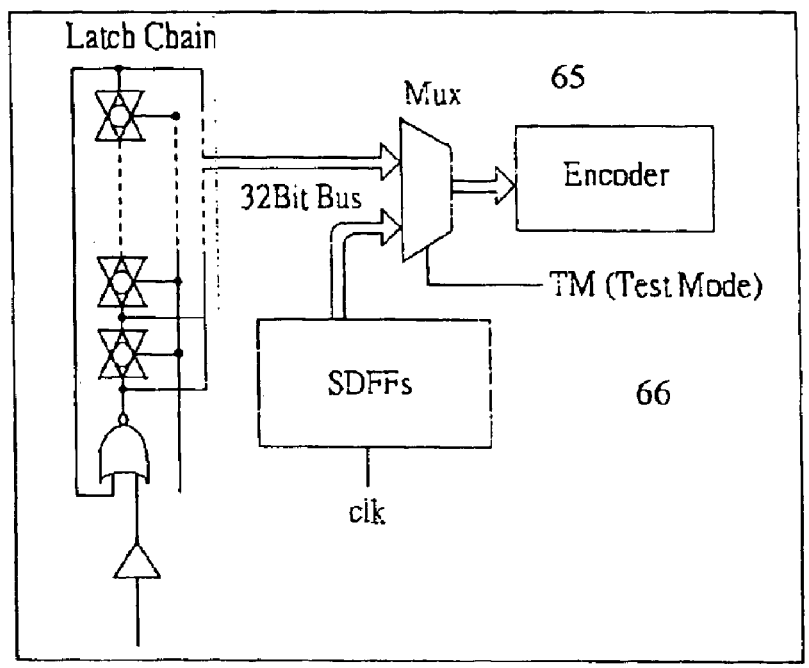
FIG. 6b is a design block diagram illustrating a test circuit having multiplexers and D flip-flops.

Refer to FIG. 6b, a DfT (Design for Test) circuit is embedded in the measurement circuit. Before implement with full scan design, the fault coverage achieved is only 63%. If only full scan is implemented, then the fault coverage can be improved as 82%. When the circuit further comprises a multiplexer 65 and a D flip-flop 66 for correcting random output of latch chain, the fault coverage is increased as 91% and the test coverage is increased as 100%.

Figure 7:
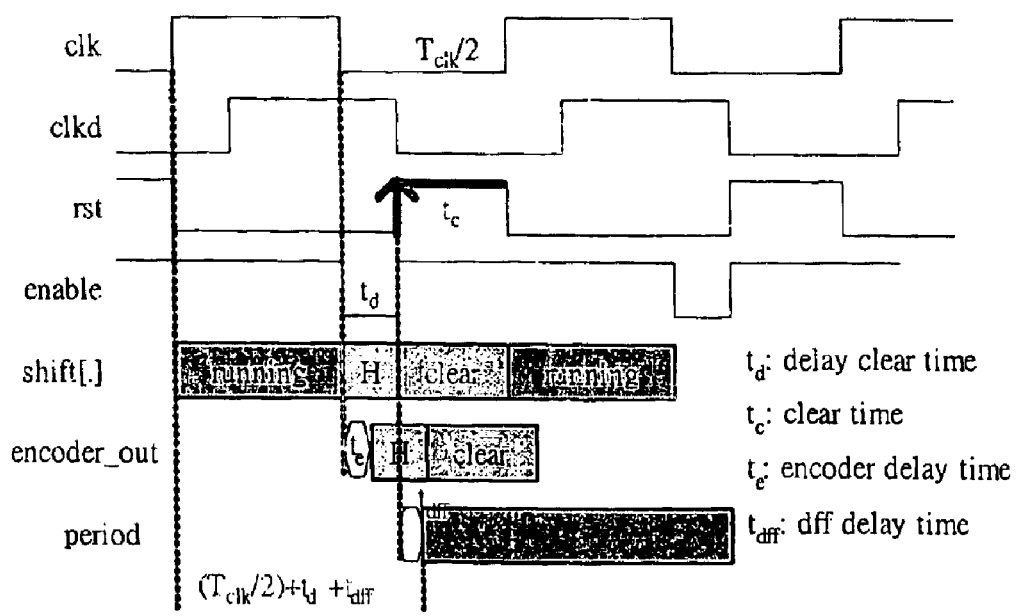
FIG. 7 is a timing diagram illustrating the TDC.

To realize the function of TDC 6 described previously, the timing design implemented in the embodiment according to the present invention is as shown in FIG. 7. A first clock clk is delayed for a time $t_d$ and results in a second clock clkd. The clkd is used for assisting to the timing control of a reset signal rest and control signal enable. When the first clock goes to high level, the operation mode is in the RUN mode. When the first clock goes to low level, the operation mode is in a HOLD mode. When the reset signal rst goes to rising edge, the value of the encoder and counter is latched. It follows that the latch chain is cleared to zero and the operation mode enters into CLEAR mode before the following first clock clk goes to high level.

The present invention is characterized by being able to perform operating modes of HOLD, CLEAR and RUN in the same cycle, and the digital signal measured is in proportion to the time duration of high level. Consequentially, the width of high (the time duration that signal equals to 1) must have to form a stable duty cycles, thus the measurement result is in proportion to the period. The divider used in the present invention provides a stable duty cycle signal to the TDC when n>=2. The present invention provides a continuous measuring of period for each clock generated without waiting.

Equalization encoding is another concept proposed in the present invention for eliminating measurement errors. Such measurement errors are caused by the difference between the rising-time and the falling-time in each standard cell. Such measurement errors also result in depicted errors of the TDC output. An example is described as below. As shown in the FIG. 8, the first column represents steps the signal in the latch chain moved, and the second column represents the actual delay time depicted. It is noted that the difference between the beginning digital values is low due to the delay time is short, and the difference between the following digital values is high due to the delay time is long. If a traditional encoding (T.E.) is implemented in the example, the same steps result in the same code. Thus, based on the T.E., depicted time represented by the digital values output from the TDC results in significant errors. The third column is the T.E. The fourth column is the depicted delay indicated by each code. The fifth column is the error percentage of the difference of indicated time and the actual time, and divided by the average time step, wherein the average time step is 2.4 ns/8=0.3 ns:

$$\text{Error} = \frac{\text{Encoded Delay} - \text{Actual Delay}}{\text{Averge Time Step}} \times 100\%$$

The equalization encoding proposed by the present invention is a method for selecting a code, which is the closest value of the output digital value output from the TDC. The delays between adjacent codes almost equal to each other hence the method is called equalization code. Such method can be designed in the register transfer level before the synthesis. The area and speed achieved by the circuit mentioned above is similar to the area and speed achieved by the circuit synthesized by T.E. The sixth column in the FIG. 8 is the equalization encoding (E.E.) proposed in the present invention. The seventh column is the depicted time indicated. The eighth column is the accumulated delay time based on the E.E. according to the present invention. According to data in the eighth column, it is noted that the E.E. of present invention significantly eliminates the errors compare to the T.E.

(III) Simulation Result of the Embodiment of the Present Invention

Simulation result of the embodiment is described in the FIG. 9, FIG. 10 and FIG. 11 for a TSMC 0.25 um design, wherein T is the period of an input signal, $\sigma_x$ is the jitter of the input signal, n is the divisor applied in the input divider, and mean and var2 are the digital output values from the embedded test circuit. Jitter $\sigma_m$ and the measurement errors can be attained from the equation as follows:

$$\sigma_m = \sqrt{n \times \text{var2}} \times \frac{T}{\text{mean}}$$

$$\text{error} = \frac{\sigma_m - \sigma_x}{\sigma_x} \times 100\%$$

For signal with different input period, if n is fixed as 64, and input signal jitter is fixed as 300 ps, then the measurement error is less than 4.23%. The minimum of an input period is limited by three factors. The first is the maximum of the operating speed of the divider, second is the maximum operating speed of the TDC, the third is the jitter can not too large compared to the signal average period. The last row shown in the FIG. 9 is in violation of the third factor mentioned above. Those factors can be expressed in the equations as follows:

$$T \geq 0.85 \text{ ns}$$

$$nT \geq 30 \text{ ns}$$

$$T \geq 10\sigma_x \text{ (If } x_i \text{ is within } \pm 5\sigma_x)$$

The digital width of TDC determine the maximum of the input period. For a 12 bit design, if the signal period is lower than $0.3 \times 20 \times 2^{12}$(ns)=24.6(us), the error is limited within 5%. Such a range of input signal is subject to the design of a circuit.

FIG. 10 and FIG. 11 are simulation results of output jitter by different settings of the divisor and the input jitter. Most of the results indicate that the error is small. It is observed that, for signal having different $\sigma_x$, the n has to follow the equation below to limit the error within 5%.

$$0.3 \times \sqrt{20} < \sqrt{n}\sigma_x < 0.3 \times 2^7 \times \frac{1}{5} \rightarrow 1.34 \text{ ns} < \sqrt{n}\sigma_x < 7.68 \text{ ns}$$

Errors observed in the first row in the FIG. 10 and the first and the second row in the FIG. 11 are significant due to the fact that $\sqrt{n}\sigma_x$ is too small. The last row in the FIG. 10 fails to perform the simulation because the $\sqrt{n}\sigma_x$ is too large.

In conclusion, given the period and jitter of a signal to be measured may be different, as long as an appropriate n is selected to introduce in the equations above, simulation results can be attained accurately. In example of the simulation result by the last row in the FIG. 11, the input clock is 1.5 ns and jitter is only 40 ps, for n=1024, the error is only 2%.

Based on the accompanying drawings, a practical embodiment of a built-in jitter measurement circuit for a voltage-controlled oscillator and a phase-locked loop according to the present invention have been described. However, the present invention is not limited to the illustrated method. It will be apparent to those skilled in the art that various changes, improvements, and modifications can be made thereto without departing from the spirit or scope of the invention.

What is claimed is:

1. A built-in jitter measurement circuit for a voltage-controlled oscillator (VCO) and a phase-locked loop (PLL) comprising:

a divider for dividing frequency of a signal to be measured by n;

a state controller as a controller for components in the built-in jitter measurement circuit;

a variance calculator for calculating variance of the signal to be measured;

a mean calculator for calculating mean of the signal to be measured;

a time to digital converter (TDC) for converting the period of the signal to be measured into digital values; and a encoder and counter for counting and encoding the digital values output from TDC;

wherein, the divider divides the frequency of the signal to be measured, the period of the divided signals to be measured are converted into digital values by TDC, encoder and counter, the digital values are calculated by the variance calculator and the mean calculator, and period means and jitter of the divided signal are determined.

2. The circuit of claim 1, wherein after the period mean and the jitter of the divided signal are determined, the circuit further comprises a step of performing calculation according to the equation as following
$$Y' = \{y_1 + e_1, y_2 + e_2, y_{y_3} + e_3, \ldots\}$$
$$M_{Y'} = nM_X + M_E$$
$$\sigma^2_{Y'} = n\sigma^2_X + \sigma^2_E,$$

for determining the period jitter of the original signal ($\sigma_x$).

3. The circuit of claim 1, wherein the TDC further comprises a latch chain, a counter, an encoder and a set of flip-flops.

4. The circuit of claim 3, wherein the TDC performs operating modes of HOLD, RUN and CLEAR in a single synchronous cycle.

5. The circuit of claim 3, wherein the encoder uses equalization encoding for linearizing the output of the TDC and balancing the difference between rising-time and falling-time of the signal in a standard cell in the latch chains so as to enhance measurement precision.

6. The circuit of claim 3, wherein the circuit further comprises a multiplexer and a set of D flip-flops for correcting random output of the latch chain and increasing fault coverage.

* * * * *